United States Patent [19]

Sakamoto

[11] Patent Number: 5,321,305
[45] Date of Patent: Jun. 14, 1994

[54] LED MANUFACTURING FRAME AND METHOD OF USING THE SAME FOR MANUFACTURING LEDS

[75] Inventor: Yuji Sakamoto, Kyoto, Japan
[73] Assignee: Rohm Co., Ltd., Kyoto, Japan
[21] Appl. No.: 45,187
[22] Filed: Apr. 13, 1993
[30] Foreign Application Priority Data
  Apr. 17, 1992 [JP]  Japan ............................ 4-097748
[51] Int. Cl.⁵ .............. H01L 23/48; H01L 29/44; H01L 29/52; H01L 29/60
[52] U.S. Cl. ............................. 257/666; 257/81; 257/670
[58] Field of Search ............. 257/666, 88, 89, 81, 257/82

[56] References Cited

U.S. PATENT DOCUMENTS

| | | | |
|---|---|---|---|
| 4,446,375 | 5/1984 | Aird ......................... | 257/666 |
| 4,532,538 | 7/1985 | Wurz ......................... | 257/666 |
| 5,218,233 | 6/1993 | Takahashi ................... | 257/666 |

FOREIGN PATENT DOCUMENTS

| | | | |
|---|---|---|---|
| 59-111378 | 6/1984 | Japan ......................... | 257/82 |
| 60-84889 | 5/1985 | Japan ......................... | 257/82 |
| 1-32688 | 2/1989 | Japan ......................... | 257/81 |

*Primary Examiner*—Rolf Hille
*Assistant Examiner*—S. V. Clark
*Attorney, Agent, or Firm*—William H. Eilberg

[57] ABSTRACT

An LED manufacturing frame comprises a first tie bar extending longitudinally of the frame, a second tie bar also extending longitudinally of the frame substantially in parallel to the first tie bar, and plural groups of first to fourth consecutive leads connecting between the first and second tie bars. The first and third leads have respective extensions extending transversely beyond the first tie bar to provide first side pairs of chip bonding and wire bonding ends. Similarly, the second and fourth leads have respective extensions extending transversely beyond the second tie bar to provide second side pairs of chip bonding and wire bonding ends.

5 Claims, 7 Drawing Sheets

LED MANUFACTURING FRAME AND METHOD OF USING THE SAME FOR MANUFACTURING LEDS

BACKGROUND OF THE INVENTION

1. Field of the Invention:

This invention relates to a frame which is used for manufacturing light emitting diodes (commonly abbreviated as "LED"). The present invention also relates to a method of using such a frame for efficiently manufacturing LEDs.

2. Description of the Prior Art:

Like other electronic components, LEDs are manufactured by using such a frame as shown in FIG. 7 of the accompanying drawings. Usually, the frame has a strip form with a limited length and is known as "leadframe".

As shown in FIG. 7, the frame or leadframe, generally designated by reference numeral 1, is prepared by punching a metal sheet to have a base bar 3 extending longitudinally of the frame and a tie bar 4 also extending longitudinally of the frame in parallel to the base bar 3. The base bar 3 is formed with a plurality of indexing holes 2 which are used for longitudinally transferring the frame 1.

Between the base bar 3 and the tie bar 4, there are multiple pairs of leads 5, 6 arranged at a constant pitch longitudinally of the frame 1. The respective pairs of leads 5, 6 extend beyond the tie bar 4 to provide corresponding pairs of chip bonding cup end 7 and wire bonding end 8. Near the pairs of cup end 7 and wire bonding end 8, the respective leads 5, 6 are connected together by a reinforcing bar 4a extending longitudinally of the frame 1 laterally outwardly of the tie bar 4, thereby increasing the supporting rigidity or stability for the respective pairs of cup end 5 and wire bonding end 6.

For manufacturing LEDs, the frame 1 is first introduced into a bonding unit (not shown) in which an LED chip 9 is bonded to each chip bonding cup end 7, as shown in FIG. 8. In the bonding unit, further, a metal wire 10 is bonded to the LED chip 9 and to a corresponding wire bonding end 8. Such a bonding operation is performed individually for the respective pairs of cup end 7 and wire bonding end 8 as the frame 1 is transferred stepwise by utilizing the indexing holes 2.

Then, the frame 1 is introduced into a molding unit (not shown) wherein a resin package (not shown) is formed to enclose each pair of cup end 7 and wire bonding end 8. The resin package may be made of a transparent resin material such as epoxy to have a general shape of a bullet.

Finally, the respective packaged LED devices are separated from the frame 1 by cutting the leads 5, 6 near the base bar 3 and by cutting the tie bar 4 and the reinforcing bar 4a near the respective leads 5, 6. Thus, product LED devices are obtained each of which has a pair of leads 5, 6 extending from the unillustrated resin package.

The prior art described above is disadvantageous at least in the following points.

First, the pairs of cup end 7 and wire bonding end 8 are provided only on one side of the frame 1. Since the spacing or pitch between the respective pairs of cup end 7 and wire bonding end 8 must be rendered sufficiently large to enable formation of the relatively bulky resin packages, there is a limitation in increasing the number of obtainable LEDs per unit length of the frame. As a result, the production efficiency lowers, and much portion of a metal sheet is wasted at the time of punching it into the frame, thereby increasing the production cost per LED.

Secondly, since the frame 1 has a strip-form with a limited length, plurality of such frames need be successively transferred and handled in actual manufacture of LEDs. Specifically, at the entrance and exit of each of the different process units (e.g. a bonding unit, a molding unit, and etc.), the frames need be stacked in a frame magazine. Thus, it is necessary to provide some mechanism which individually picks up from or discharge into the frame magazine. It is further necessary to provide some mechanism for transferring the frame magazine between the different process units. As a result, the cost of the manufacturing apparatus is relatively high, but yet the production efficiency is relatively low due to the need for individually handling the strip-like frames.

SUMMARY OF THE INVENTION

It is, therefore, an object of the present invention to provide an LED manufacturing frame which provides a greatly increased number of obtainable LEDs per unit length of the frame.

Another object of the invention is to provide a method of efficiently manufacturing LEDs at a reduced cost from a continuous frame.

According to one aspect of the present invention, there is provided an LED manufacturing frame comprising: a first tie bar extending longitudinally of the frame; a second tie bar also extending longitudinally of the frame substantially in parallel to the first tie bar; first side pairs of chip bonding and wire bonding lead ends arranged transversely outwardly of the first tie bar substantially at a constant pitch; and second side pairs of chip bonding and wire bonding lead ends arranged transversely outwardly of the second tie bar substantially at the same pitch as the first side pairs of chip bonding and wire bonding lead ends.

In a preferred embodiment of the present invention, the first and second tie bars are connected together by plural groups of first to fourth consecutive leads. The first side pairs of chip bonding and wire bonding lead ends are provided by respective extensions of the first and third leads, whereas the second side pairs of chip bonding and wire bonding lead ends are provided by respective extensions of the second and fourth leads.

According to another aspect of the present invention, there is provided a method of manufacturing LEDs from a continuous frame which comprises: a first tie bar extending longitudinally of the frame; a second tie bar also extending longitudinally of the frame substantially in parallel to the first tie bar; first side pairs of chip bonding and wire bonding lead ends arranged transversely outwardly of the first tie bar substantially at a constant pitch; and second side pairs of chip bonding and wire bonding lead ends arranged transversely outwardly of the second tie bar substantially at the same pitch as the first side pairs of chip bonding and wire bonding lead ends; the method comprising performing the following process steps while transferring the continuous frame longitudinally thereof:

(a) bonding an LED chip to each of the chip bonding lead ends, and thereafter bonding a metal wire to the LED chip and to a corresponding wire bonding lead end;

(b) forming a resin package to enclose each pair of chip bonding and wire bonding lead ends together with the LED chip and the wire;

(c) longitudinally separating the frame into a first frame portion which contains the first tie bar together with the first side pairs of chip bonding and wire bonding lead ends, and a second frame portion which contains the second tie bar together with the second side pairs of chip bonding and wire bonding lead ends, the first and second frame portions being used for subsequent transfer; and (d) separating said each pair of chip bonding and wire bonding lead ends, which has been enclosed in the resin package, from a corresponding one of the first and second frame portions to provide a product.

Preferably, the bonding step (a) is performed separately in two different bonding units with respect to the first side pairs of chip bonding and wire bonding lead ends and the second side pairs of chip bonding and wire bonding lead ends, and the continuous frame is twisted by 180° between the respective bonding units. Similarly, it is also advantageous that the molding step (b) is performed separately in two different bonding units with respect to the first side pairs of chip bonding and wire bonding lead ends and the second side pairs of chip bonding and wire bonding lead ends, and the continuous frame is twisted by 180° between the respective molding units.

Other objects, features and advantages of the present invention will become apparent from the following detailed description of the preferred embodiments given with reference to the accompanying drawings.

DETAILED DESCRIPTION OF THE PREFERRED EMBODIMENTS

Figure 1:
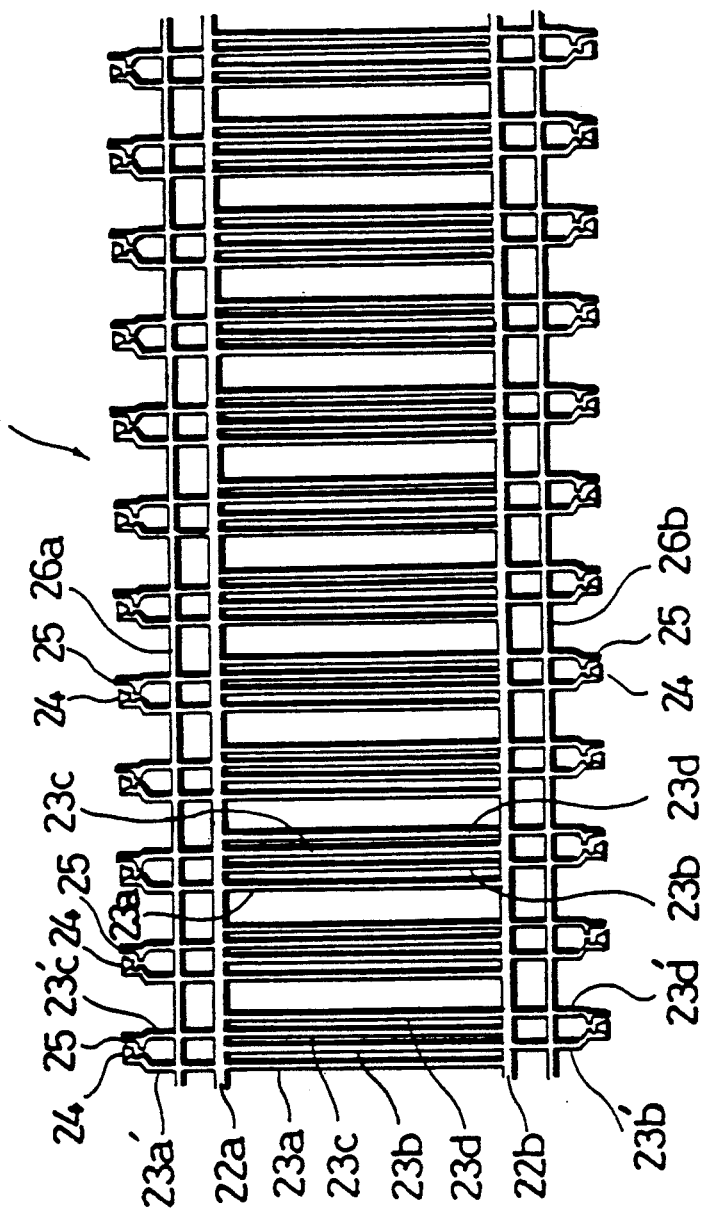
FIG. 1 is a plan view showing a portion of an LED manufacturing frame according to the present invention.

Referring first to FIG. 1 of the accompanying drawings, there is shown an LED manufacturing frame according to the present invention. The frame, which is generally designated by reference numeral 21, is prepared by punching a metal sheet. The frame 21 is substantially continuous, and only a portion of it is shown in FIG. 1.

The frame 21 comprises a first tie bar 22a extending longitudinally of the frame along one side thereof, and a second tie bar 22b also extending longitudinally of the frame along the other side thereof in parallel to the first tie bar 22a. Between the first and second tie bars 22a, 22b, there are multiple groups of first to fourth consecutive leads 23a–23d arranged at a constant pitch longitudinally of the frame 21.

In each group of first to fourth leads, the first and third leads 23a, 23c have paired extensions 23a', 23c' extending beyond the first tie bar 22a widthwise (transversely) of the frame 21. The extension 23a' of the first lead 23a has a chip bonding cup end 24, whereas the extension 23c' of the third lead 23c has a wire bonding end 25. The respective extensions 23a', 23c' of the first and third leads 23a, 23c are connected together by a first reinforcing bar 26a extending longitudinally of the frame 21 laterally outwardly of the first tie bar 22a, thereby increasing the supporting rigidity or stability for the cup end 24 and the wire bonding end 25.

Similarly, the second and fourth leads 23b, 23d in each lead group have paired extensions 23b', 23d' extending beyond the second tie bar 22b widthwise (transversely) of the frame 21. The extension 23b' of the second lead 23b has a chip bonding cup end 24, whereas the extension 23d' of the fourth lead 23d has a wire bonding end 25. The respective extensions 23b', 23d' of the second and fourth leads 23b, 23d are connected together by a second reinforcing bar 26b extending longitudinally of the frame 21 laterally outwardly of the second tie bar 22b, thereby increasing the supporting rigidity or stability.

Figure 2:
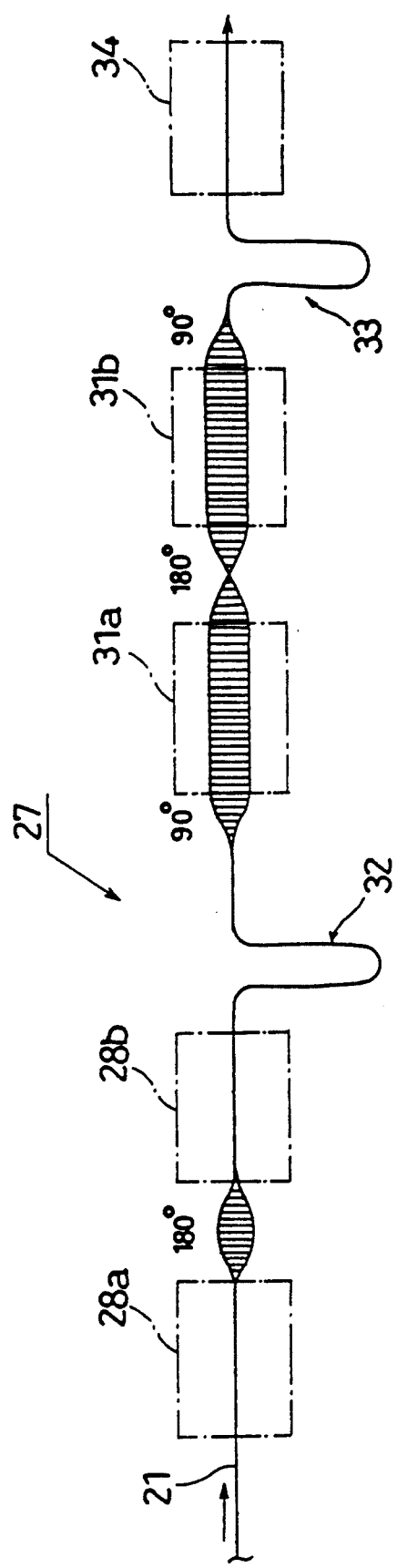
FIG. 2 is a schematic view showing a method of manufacturing LEDs with the use of the frame shown in FIG. 1.

FIG. 2 schematically illustrates a method and apparatus for manufacturing LEDs from the continuous LED manufacturing frame 21 described above. In manufacture, the LED manufacturing frame 21 is caused to longitudinally pass through the LED manufacturing apparatus 27. This apparatus 27 mainly includes a first bonding unit 28a, a second bonding unit 28b, a first molding unit 31a, a second molding unit 31b, and a frame cutting unit 34, all of which are arranged in succession in the mentioned order.

Figure 3:
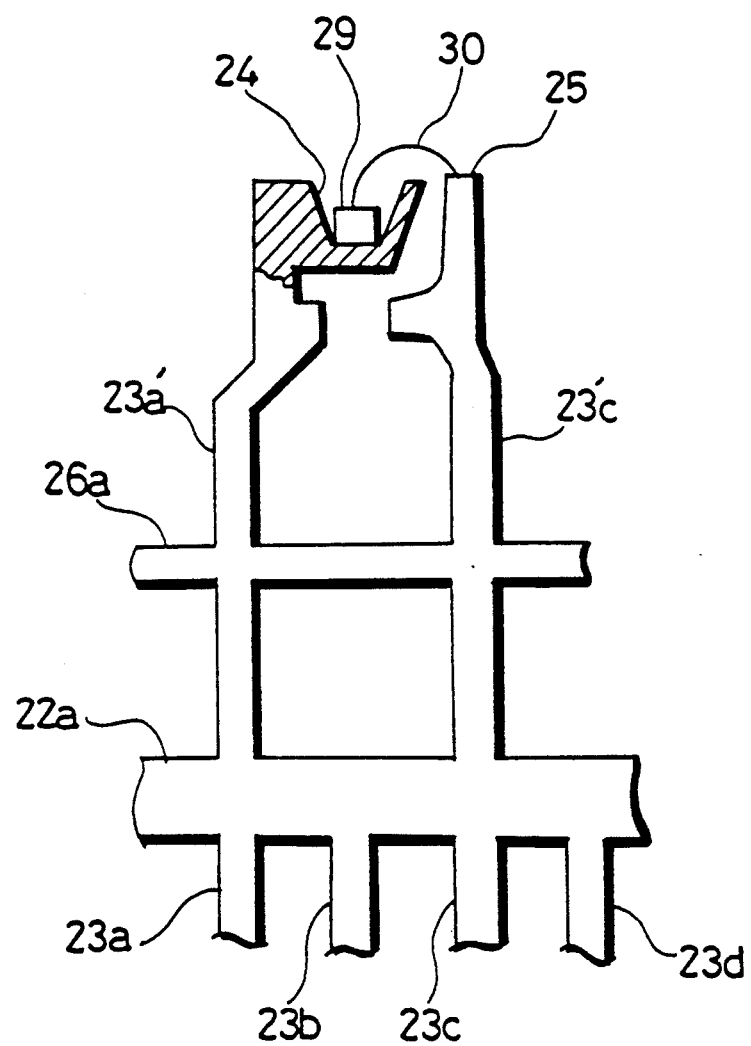
FIG. 3 is a fragmentary plan view showing a bonding step of the LED manufacturing method.

In the first bonding unit 28a, an LED chip 29 is bonded to each cup end 24 located closer to the first tie bar 22a, and a wire 30 of gold for example is bonded to the thus mounted chip 29 and its counterpart wire bonding end 25, as shown in FIG. 3. A similar bonding operation is also performed in the second bonding unit 28b with respect to each pair of cup end 24 and wire bonding end 25 located closer to the second tie bar 22b.

According to the illustrated embodiment, the frame 21 is twisted by 180° between the first and second bonding units 28a, 28b, as shown in FIG. 2. Thus, the respective bonding units 28a, 28b can be made to perform the bonding operation from the same side of the frame transfer path. As a result, the respective bonding units 28a, 28b may have an identical structure, thereby contributing to a cost reduction.

Figure 4:
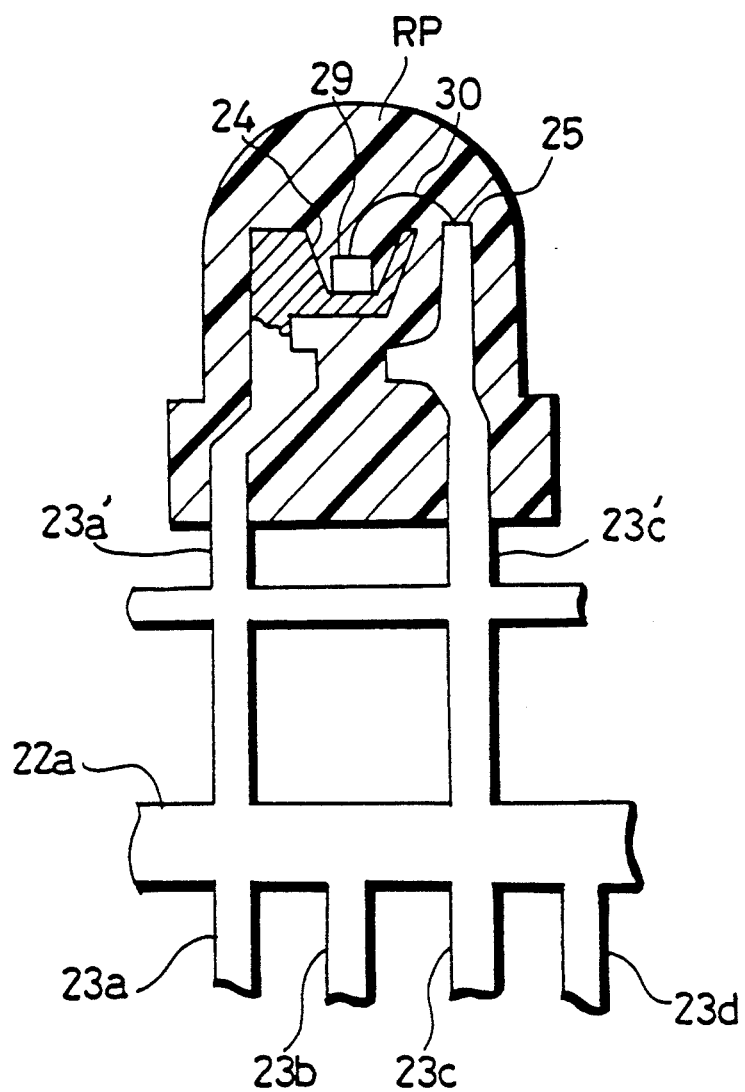
FIG. 4 is also a fragmentary plan view, partially in section, showing a molding step of the LED manufacturing method.

In the first molding unit 31a, a resin package RP is molded to enclose each pair of cup end 24 and wire bonding end 25 located closer to the first tie bar 22a, as shown in FIG. 4. A similar molding operation is also performed in the second molding unit 31b with respect to each pair of cup end 24 and wire bonding end 25 located closer to the second tie bar 22b. The resin package RP may be made of a transparent thermosetting resin such as epoxy to have a generally bullet form although it may be otherwise shaped.

In each of the first and second molding units 31a, 31b, the package molding operation is normally performed batchwise for plural pairs of lead extensions 23a', 23c' or 23b', 23d' located closer to the corresponding tie bar 22a or 22b. Thus, at the respective molding units, the continuous frame 21 need be transferred intermittently by a predetermined length which corresponds to the plural pairs of lead extensions.

On the other hand, the bonding operation is performed individually for each pair of lead extensions 23a', 23c' or 23b', 23d'. Thus, at the respective bonding units 28a, 28b, the continuous frame 21 need be transferred constantly by a small amount corresponding to the pitch between the respective pairs of lead extensions.

According to the illustrated embodiment, a first buffer or excess portion 32 is formed in the frame 21 between the second bonding unit 28b and the first molding unit 31a, as shown in FIG. 2. This buffer portion 32 compensates for the above-described difference in transfer mode between the bonding operation and the molding operation.

As clearly appreciated in FIG. 2, the frame 21 is twisted by 90° before entering the first molding unit 31a, and additionally twisted by 180° between the first and second molding units 31a, 31b. Such twisting makes each pair of cup end 24 and wire bonding end 25 to be directed vertically downward at the time of molding, so that the pair of cup end 24 and wire bonding end 25 is conveniently dipped, from above, in a fluid resin loaded in a mold recess which is upwardly open. Further, the 180° twisting between the first and second molding units 31a, 31b enables these molding units to have an identical structure, thereby contributing to a cost reduction.

After passing the second molding unit 31b, the frame 21 is twisted by 90° and merges in a second buffer or excess portion 33. Then, the frame enters the frame cutting unit 34 and moves therethrough substantially continuously. At this time, the second buffer portion 33 compensates for the difference between the intermittent transfer in the respective molding units 31a, 31b and the continuous transfer in the frame cutting unit 34.

Figure 5:
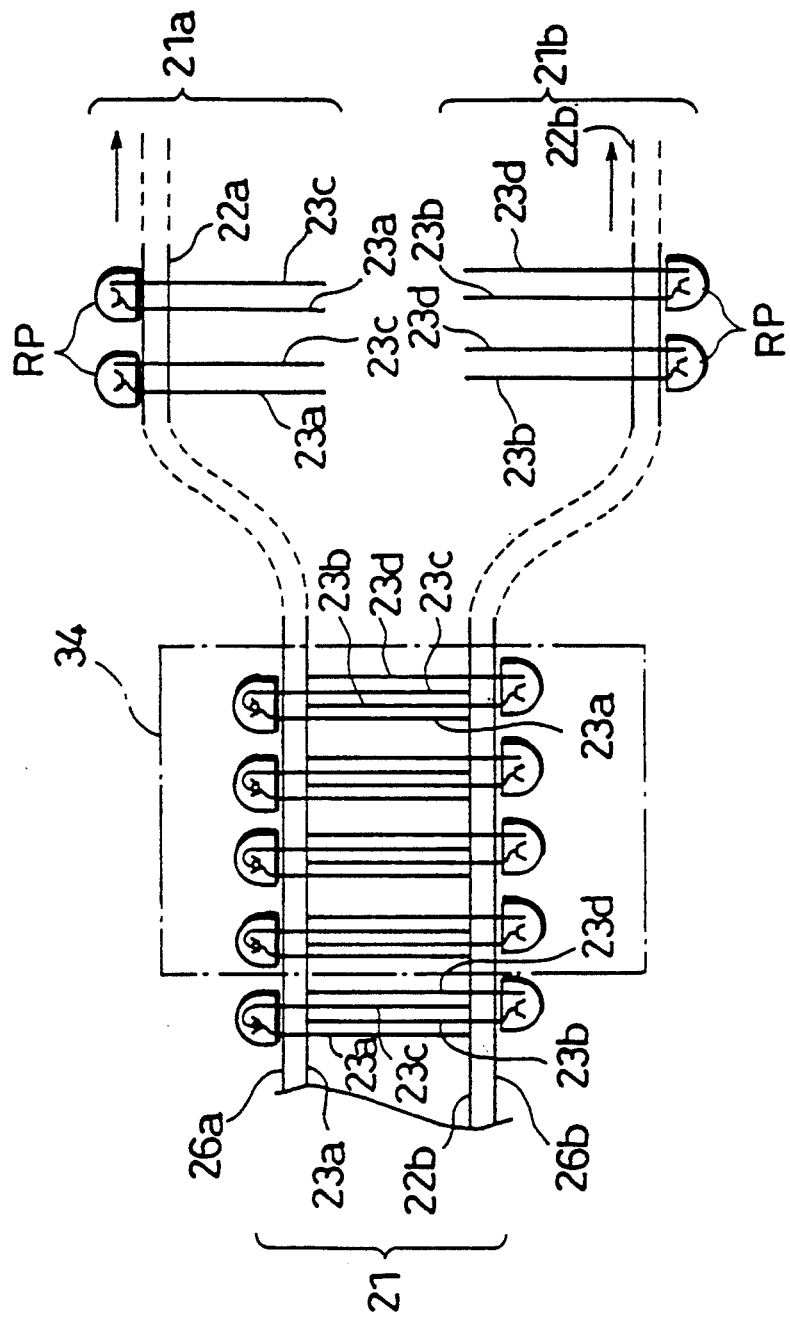
FIG. 5 is a schematic plan view showing a cutting step of the LED manufacturing method.

In the frame cutting unit 34, the first and third leads 23a, 23c in each lead group are cut off the second tie bar 22b adjacent thereto, whereas the second and fourth leads 23b, 23d in each lead group are cut off the first tie bar 22a adjacent thereto, as shown in FIG. 5. As a result, the frame 21 is separated into a first frame portion 21a associated with the first tie bar 22a, and a second frame portion 21b associated with the second tie bar 22b. Each of the frame portions 21a, 21b carries a plurality of unit LEDs connected to the corresponding tie bar 22a or 22b adjacent to the respective resin packages RP at a constant pitch.

Then, each of the respective frame portions 21a, 21b with the connected LEDs is passed through subsequent process units (not shown) such as an inspection unit. Apparently, the use of the frame portions 21a, 21b enables continuous transfer, so that the subsequent process steps may be performed very efficiently.

Figure 6:
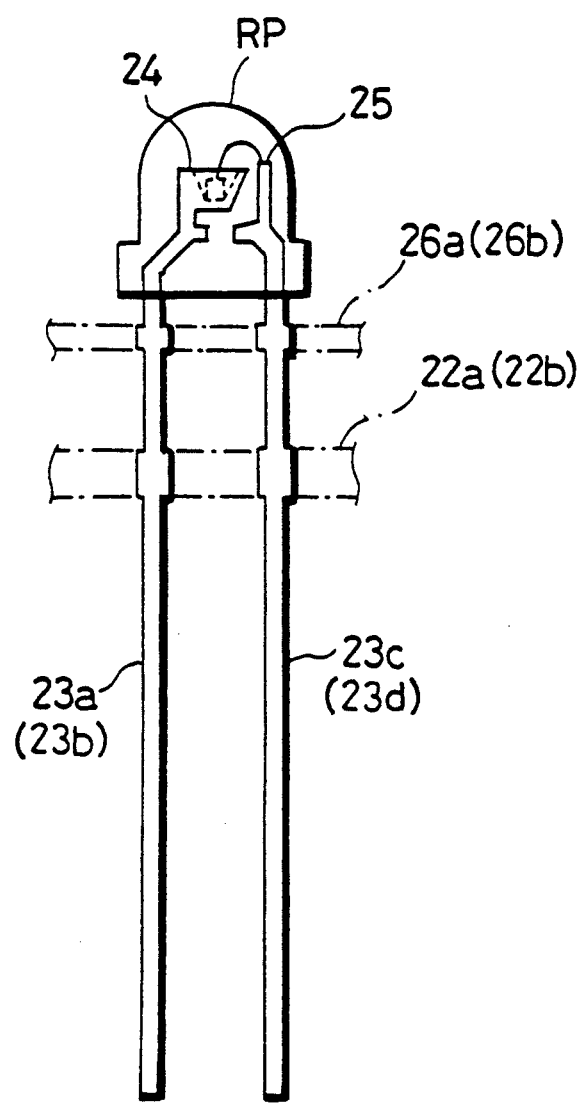
FIG. 6 is a view showing a product separation step of the LED manufacturing method.
Figure 7:
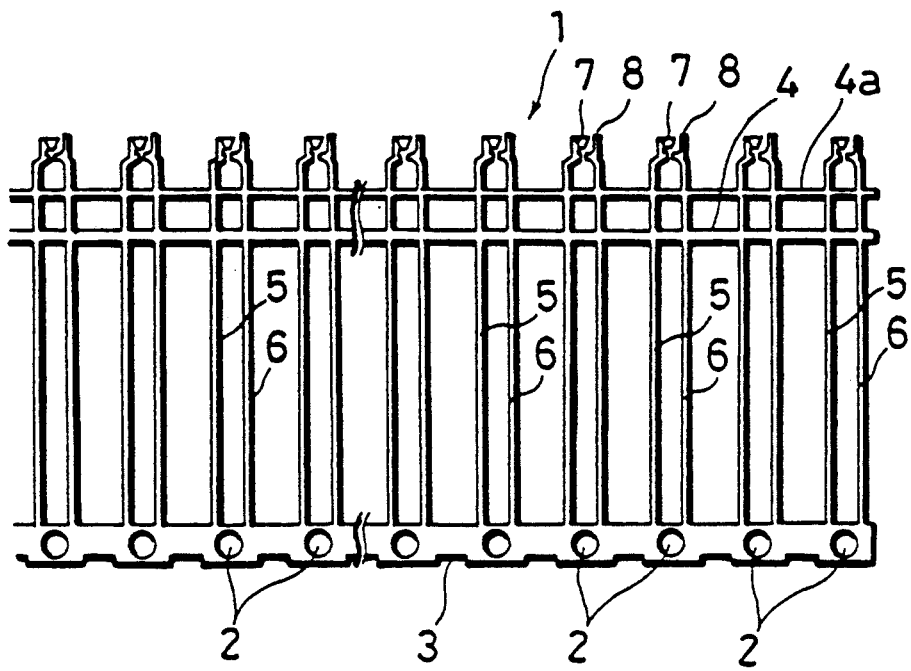
FIG. 7 is a plan view showing a prior art LED manufacturing frame.
Figure 8:
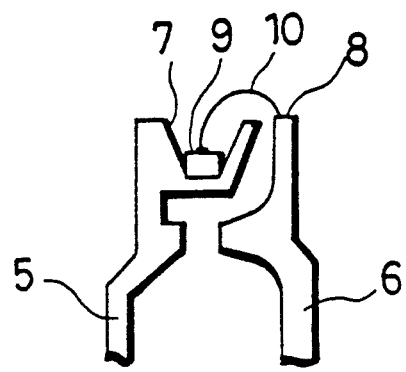
FIG. 8 is an enlarged fragmentary plan view showing a principal portion of the prior art frame.

Finally, each of the LEDs is cut off the corresponding tie bar 22a or 22b to provide a final product, as shown in FIG. 6.

According to the present invention, the respective extensions 23a', 23c' of the first and third leads 23a, 23c provide first side pairs of cup end 24 and wire bonding end 25 located closer to the first tie bar 22a, whereas the respective extensions 23b', 23d' of the second and fourth leads 23b, 23d provide second pairs of cup end 24 and wire bonding end 25 located closer to the second tie bar 22b. In other words, both sides of the frame 21 are utilized for providing pairs of cup end 25 and wire bonding end 25. Thus, the number of LEDs obtainable from a unit length of the frame 21 is almost doubled while ensuring a sufficient spacing between two adjacent LEDs as required for formation of the resin package RP with a suitable size. As a result, it is possible to realize a great material saving and a reduction of the production cost.

On the other hand, the continuous nature of the frame 21 facilitates longitudinal transfer through the different process units and the continuity of the process steps, as opposed to the use of the conventional strip-like frames which need be handled and transferred separately. Thus, the manufacturing apparatus 27 as a whole can be simplified in configuration, and the production efficiency is greatly improved.

Further, the continuous nature enables the frame 21 to be easily twisted during transfer. Such twistability of the frame 21 is advantageous at least for the following reasons.

First, the two process units assigned to perform the same process step on the different sides of the frame 21 can be made to have the same structure, thereby additionally contributing to the cost reduction. In the illustrated embodiment for example, the first and second bonding units 28a, 28b are made to have the same structure, as also are the first and second molding units 31a, 31b.

Secondly, the frame 21 can be made to assume a posture or orientation which is most suitable for any particular process step. In the illustrated embodiment for example, the frame 21 is vertically oriented in each of the respective molding units 31a, 31b, so that the molding operation can be conveniently performed.

The present invention is not limited to the specific embodiment described herein and illustrated in the accompanying drawings. For instance, the first and second reinforcing bars 26a, 26b, though preferable for improving supporting rigidity or stability for each pair of cup end 24 and wire bonding end 25, may be omitted.

According to the illustrated embodiment, the bonding operation is performed separately with respect to both sides of the frame 21 in the first and second bonding units 28a, 28b, respectively. However, the bonding operation may be performed simultaneously with respect to both sides of the frame 21 in a single bonding unit.

Further, the formation of the resin package RP (see FIG. 4) can be performed in various ways which include the injection molding, and etc.

Finally, it should be understood that all such modifications as would be obvious to those skilled in the art art intended to be included in the scope of the present invention as defined in the appended claims.

I claim:
1. An LED manufacturing frame comprising:
  a first tie bar extending longitudinally of the frame;
  a second tie bar also extending longitudinally of the frame and transversely spaced from the first tie bar substantially in parallel thereto;
  first side pairs of chip bonding and wire bonding lead ends arranged transversely outwardly of the first tie bar away from the second tie bar substantially at a constant pitch; and
  second side pairs of chip bonding and wire bonding lead ends arranged transversely outwardly of the second tie bar away from the first tie bar substan- tially at the same pitch as the first side pairs of chip bonding and wire bonding lead ends.

2. The frame according to claim 1, wherein the first and second tie bars are connected together by plural groups of first to fourth consecutive leads, the first side pairs of chip bonding and wire bonding lead ends being provided by respective extensions of the first and third leads, the second side pairs of chip bonding and wire bonding lead ends being provided by respective extensions of the second and fourth leads.

3. The frame according to claim 1, wherein each of the chip bonding lead ends has a cup form.

4. The frame according to claim 2, wherein the respective extensions of the first and third leads are connected together by a first reinforcing bar extending laterally outwardly of the first tie bar in parallel thereto, the respective extensions of the second and fourth leads being also connected together by a second reinforcing bar extending laterally outwardly of the second tie bar in parallel thereto.

5. The frame according to claim 1, wherein the frame is substantially continuous.

* * * * *